(12) United States Patent
Lee et al.

(10) Patent No.: US 9,726,917 B2
(45) Date of Patent: Aug. 8, 2017

(54) IMAGE DISPLAY DEVICE AND METHOD FOR MANUFACTURING THE SAME

(71) Applicant: LG Display Co., Ltd., Seoul (KR)

(72) Inventors: Yun-Gil Lee, Gyeongsangbuk-do (KR); Jong-Yoon Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 64 days.

(21) Appl. No.: 14/582,191

(22) Filed: Dec. 24, 2014

(65) Prior Publication Data

US 2015/0177547 A1    Jun. 25, 2015

(30) Foreign Application Priority Data

Dec. 24, 2013    (KR) .......................... 10-2013-0162289

(51) Int. Cl.
*G02F 1/1345* (2006.01)
*G02F 1/133* (2006.01)
(Continued)

(52) U.S. Cl.
CPC ...... *G02F 1/13306* (2013.01); *G02F 1/13452* (2013.01); *G02F 1/133305* (2013.01);
(Continued)

(58) Field of Classification Search
CPC ........... G02F 1/13306; G02F 1/133305; G02F 1/13452; H01J 9/20; H05K 1/0262; H05K 1/189; H05K 2201/10136
(Continued)

(56) References Cited

U.S. PATENT DOCUMENTS

2003/0077848 A1    4/2003   Ma et al.
2004/0108985 A1    6/2004   Song
(Continued)

FOREIGN PATENT DOCUMENTS

CN    1414538 A    4/2003
CN    102254523 A   11/2011
(Continued)

OTHER PUBLICATIONS

Taiwanese Office Action dated Mar. 9, 2016, for corresponding Taiwanese Patent Application No. 103143921.
(Continued)

*Primary Examiner* — Charles Chang
(74) *Attorney, Agent, or Firm* — Morgan, Lewis & Bockius LLP (57) ABSTRACT

An image display device includes an image display panel, data drive circuits, a timing control circuit, flexible printed circuits arranged between at least two of the liquid crystal panel, the data drive circuits, and the timing control circuit, to electrically connect the at least two of the liquid crystal panel, the data drive circuits, and the timing control circuit, printed circuit boards arranged between at least two of the data drive circuits, the flexible printed circuit, and the timing control circuit, to electrically connect the at least two of the data drive circuits, the flexible printed circuit, and the timing control circuit, and an element formation portion provided at at least one of the flexible printed circuit and the printed circuit board while including electrical elements regularly arranged on the element formation portion in accordance with at least one predetermined rule.

12 Claims, 4 Drawing Sheets

(51) Int. Cl.
*G02F 1/1333* (2006.01)
*H05K 1/02* (2006.01)
*H05K 1/18* (2006.01)

(52) U.S. Cl.
CPC .......... *H05K 1/0262* (2013.01); *H05K 1/189* (2013.01); *H05K 2201/10136* (2013.01)

(58) Field of Classification Search
USPC ........................................................ 349/149
See application file for complete search history.

(56) References Cited

U.S. PATENT DOCUMENTS

| | | | |
|---|---|---|---|
| 2009/0237903 A1 | 9/2009 | Onodera | |
| 2011/0285679 A1 | 11/2011 | Oh et al. | |
| 2013/0249969 A1* | 9/2013 | Jeon | G09G 5/10 345/691 |
| 2014/0354606 A1* | 12/2014 | Chen | G09G 5/18 345/204 |

FOREIGN PATENT DOCUMENTS

| | | |
|---|---|---|
| CN | 103325349 A | 9/2013 |
| JP | H11142871 A | 5/1999 |
| JP | 2009230108 A | 10/2009 |
| JP | 2009258655 A | 11/2009 |
| TW | 201445551 A | 12/2014 |

OTHER PUBLICATIONS

The First Office Action dated Aug. 2, 2016 from the State Intellectual Property Office of the People's Republic of China in counterpart Chinese Patent Application No. 201410818518.6.

The Second Office Action dated Jan. 18, 2017 from the State Intellectual Property Office of the People's Republic of China in counterpart Chinese Patent Application No. 201410818518.6. Note: CN 102254523 cited therein is already of record.

Notice of Allowance dated May 4, 2017 by the Chinese Patent Office in counterpart Chinese application No. 01410818518.6.

\* cited by examiner

IMAGE DISPLAY DEVICE AND METHOD FOR MANUFACTURING THE SAME

This application claims the benefit of Korean Patent Application No. 10-2013-0162289, filed on Dec. 24, 2013, which is hereby incorporated by reference as if fully set forth herein.

BACKGROUND OF THE INVENTION

Field of the Invention

The present invention relates to an image display device and a method for manufacturing the image display device.

Discussion of the Related Art

Recently, a liquid crystal display device, a plasma display device, a field emission display device, an organic light emitting diode display device and the like have been used as flat panel type image display devices applied to monitors of personal computers, portable terminals, and various information appliances.

Such a flat panel type image display device includes an image display panel for displaying an image, a drive circuit for driving pixels arranged on the image display panel, a control circuit for controlling driving timing of each pixel by supplying control signals to the drive circuit, and a power supply circuit for generating and outputting drive voltages having various levels. In the case of a liquid crystal display device, a backlight unit is provided at a back side of the liquid crystal panel, to emit light toward the liquid crystal panel, because the liquid crystal panel cannot emit light by itself.

In a recently developed flat panel type image display device, each of the drive circuit to drive the image display panel, control circuit, and power supply circuit is constituted by at least one integrated circuit. A plurality of electrical elements are formed at a peripheral portion of the integrated circuit, to supply driving voltages having various levels and clock signals. The plurality of electrical elements may be resistors, capacitors, inductors, transistors, and the like. Such various electrical elements are arranged at the peripheral portion of the integrated circuit electrically connected thereto.

In related art cases, however, there is a problem in that low watertightness is exhibited when moisture penetrates because various electrical elements are arranged at the peripheral portion of the integrated circuit connected thereto without any rule in accordance with a given circuit design. In detail, when moisture penetrates, electrical connection between adjacent ones of the electrical elements is inevitable. When the potential difference between the adjacent electrical elements is high, the error rate of the voltage applied to each of the adjacent electrical elements becomes higher under the condition that the adjacent electrical elements are electrically connected. For this reason, when a plurality of electrical elements is arranged at the peripheral portion of the associated integrated circuit without any rule, as in related art cases, penetration of moisture increases the possibility that an erroneous voltage is generated. In this case, the possibility that erroneous driving occurs due to the erroneous voltage is increased and, as such, reliability is greatly lowered.

SUMMARY OF THE INVENTION

Accordingly, the present invention is directed to an image display device and a method for manufacturing the same that substantially obviate one or more problems due to limitations and disadvantages of the related art.

An object of the present invention is to provide an image display device capable of improving a watertight function and reducing rate of erroneous operation through improvement of an arrangement structure of electrical elements formed at a drive circuit to drive an image display panel or a control circuit, thereby achieving an enhancement in reliability and a method for manufacturing the image display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an image display device includes an image display panel for displaying an image, a plurality of data drive circuits for driving the image display panel, a timing control circuit for controlling driving timings of the data drive circuits, at least one flexible printed circuit arranged between at least two of the liquid crystal panel, the data drive circuits, and the timing control circuit, to electrically connect the at least two of the liquid crystal panel, the data drive circuits, and the timing control circuit, at least one printed circuit board arranged between at least two of the data drive circuits, the flexible printed circuit, and the timing control circuit, to electrically connect the at least two of the data drive circuits, the flexible printed circuit, and the timing control circuit, and an element formation portion provided at at least one of the flexible printed circuit and the printed circuit board while comprising a plurality of electrical elements regularly arranged on the element formation portion in accordance with at least one predetermined rule.

In another aspect, a method for manufacturing an image display device includes preparing an image display panel to display an image, preparing a plurality of data drive circuits to drive the image display panel, preparing a timing control circuit to control driving timings of the data drive circuits, attaching at least one flexible printed circuit between at least two of the liquid crystal panel, the data drive circuits, and the timing control circuit, to electrically connect the at least two of the liquid crystal panel, the data drive circuits, and the timing control circuit, attaching at least one printed circuit board between at least two of the data drive circuits, the flexible printed circuit, and the timing control circuit, to electrically connect the at least two of the data drive circuits, the flexible printed circuit, and the timing control circuit, and regularly arranging a plurality of electrical elements on at least one of the flexible printed circuit and the printed circuit board in accordance with at least one predetermined rule, thereby configuring at least one element formation portion.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and along with the description serve to explain the principle of the invention. In the drawings.

DETAILED DESCRIPTION OF THE INVENTION

Reference will now be made in detail to the preferred embodiments of the present invention associated with an image display device and a method for manufacturing the same, examples of which are illustrated in the accompanying drawings.

As the image display device of the present invention, a liquid crystal display device, an organic light emitting display device, a plasma display panel, a field emission display device, or the like may be employed. Although technical features of the present invention are applicable to all of the above-described image display devices, the following description will be given in conjunction with an example in which the present invention is applied to the liquid crystal display device.

Figure 1:
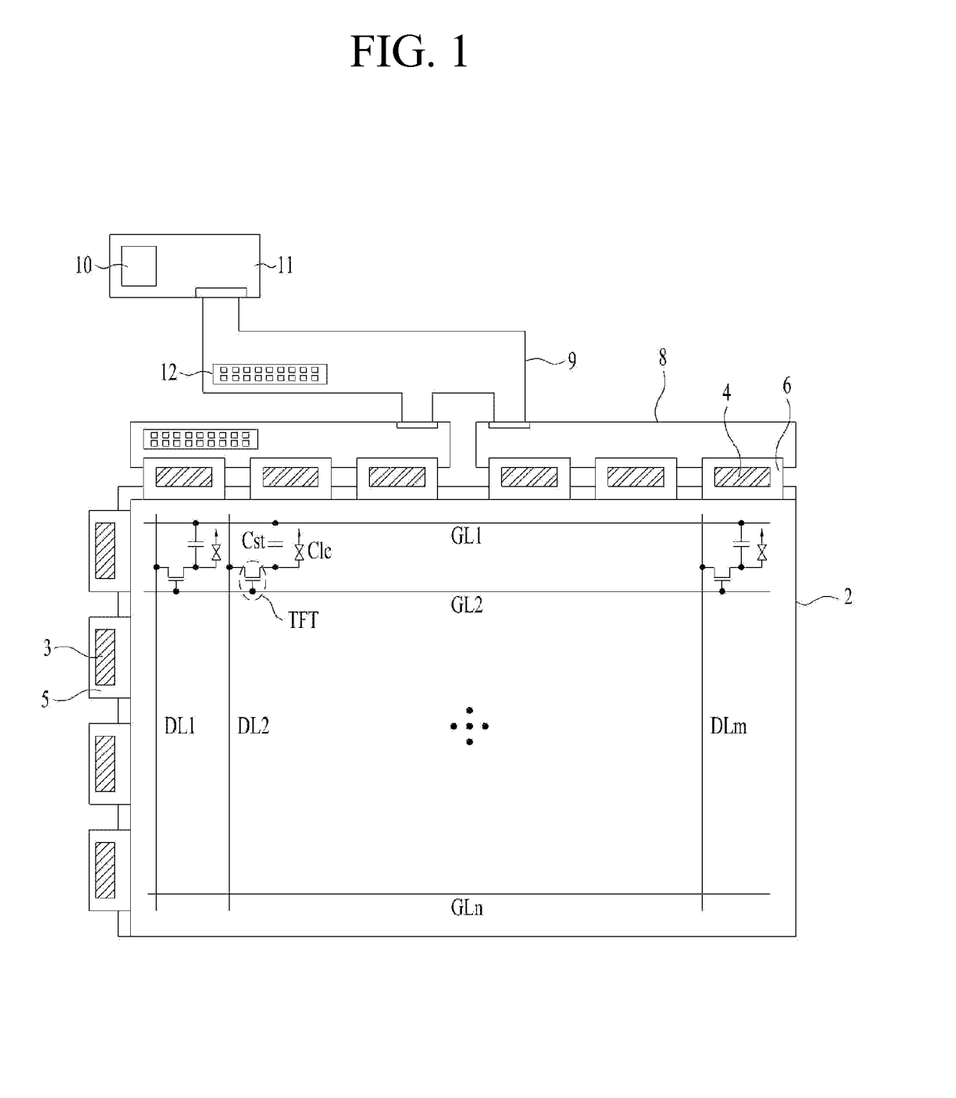
FIG. 1 is a schematic diagram illustrating a configuration of a liquid crystal display device according to an example embodiment of the present invention.

FIG. 1 is a schematic diagram illustrating a configuration of a liquid crystal display device according to an embodiment of the present invention.

The liquid crystal display device illustrated in FIG. 1 includes a liquid crystal panel 2 including a plurality of pixel regions to display an image, at least one gate drive circuit 3 for driving gate lines GL1 to GLn of the liquid crystal panel 2, a plurality of data drive circuits for driving data lines DL1 to DLm of the liquid crystal panel 2, and a timing control circuit 10 for arranging image data input from the outside of the device, supplying the arranged image data to each data drive circuit 4, and controlling driving timings of the gate drive circuit 3 and data drive circuits 4. The liquid crystal display device also includes flexible printed circuits 6 and 9 arranged between at least two of the liquid crystal panel 2, data drive circuits 4, and timing control circuit 10, to electrically connect the at least two of the liquid crystal panel 2, data drive circuits 4, and timing control circuit 10. When each data drive circuit 4 is electrically connected by a corresponding one of the flexible printed circuits 6 and 9, the data drive circuit may be mounted on the corresponding flexible printed circuit 6 or 9. The liquid crystal display device further includes printed circuit boards 8 and 11 arranged between at least two of the data drive circuits 4, flexible printed circuits 6 and 9, and timing control circuit 10, to electrically connect the at least two of the data drive circuits 4, flexible printed circuits 6 and 9, and timing control circuit 10. When the timing control circuit 10 is electrically connected by a corresponding one of the printed circuit boards 8 and 11, the timing control circuit 10 may be mounted on the corresponding printed circuit board 8 or 11. The liquid crystal display device further includes an element formation portion 12 provided at at least one of the flexible printed circuits 6 and 9 and printed circuit boards 8 and 11 while including a plurality of electrical elements regularly arranged on the element formation portion 12 in accordance with at least one predetermined rule.

The liquid crystal panel 2 includes thin film transistors (TFTs) respectively formed at pixel regions defined by the plurality of gate lines GL1 to GLn and the plurality of data lines DL1 to DLm, and liquid crystal capacitors Clc respectively connected to the TFTs. Each liquid crystal capacitor Clc includes a pixel electrode connected to the corresponding TFT, and a common electrode spaced from the pixel electrode such that liquid crystals are interposed between the common electrode and the pixel electrode. The liquid crystal capacitor Clc charges a difference voltage between an image display voltage supplied to the pixel electrode and a common voltage Vcom. In accordance with the difference voltage, alignment of molecules of the liquid crystals is varied, to adjust light transmittance and, as such, a desired grayscale is obtained. In this case, the pixel electrode may overlap with a storage line under the condition that an insulating film is interposed between the pixel electrode and the storage line, to form a storage capacitor Cst. A parasitic capacitor Cgs may further be formed between a source electrode of each TFT and the corresponding gate line GL.

Each of the data drive circuits 4 may be constituted by an integrated circuit. Each data drive circuit 4 receives arranged image data and data control signals from the timing control circuit 10. In particular, each data drive circuit 4 is mounted on a corresponding first one of the flexible printed circuits 6 and 9, namely, the corresponding flexible printed circuit 6, which is electrically connected to a first one of the printed circuit boards 8 and 11, namely, the printed circuit board 8, to drive corresponding ones of the data lines DL1 to DLm arranged at a display area corresponding to the position of the data drive circuit 4. As the flexible printed circuit 6, a tape carrier package (TCP) film or a chip on flexible printed circuit film may be used.

The data drive circuits 4 receive data control signals, for example, a source start pulse (SSP), a source shift clock (SSC), a source output enable signal, etc., from the timing control circuit 10 at the same timing. The data drive circuits 4 convert the arranged data received from the timing control circuit 10 into an analog voltage, namely, a data voltage, at the same timing. In this case, each data drive circuit 4 selects a gamma voltage corresponding to a grayscale value of the arranged data received from the timing control circuit 10, and supplies the selected gamma voltage to corresponding ones of the data lines DL1 to DLm as an image display voltage.

The gate drive circuit 3 may be constituted by an integrated circuit. The gate drive circuit 3 may be arranged at one side of the liquid crystal panel 2, to sequentially drive the gate lines GL1 to GLn. The gate drive circuit 3 is mounted on a non-display area of the liquid crystal panel 2 or a gate circuit film 5, to be electrically connected to the liquid crystal panel 2. The gate drive circuit 3 sequentially supplies a scan pulse having a gate-on voltage level to the gate lines GL1 to GLn in accordance with a gate control signal. In a period, in which no scan pulse is supplied, the gate drive circuit 3 supplies a gate-off voltage to the gate lines GL1 to GLn.

The timing control circuit 10 is arranged at a second one of the printed circuit boards 8 and 11, namely, the printed circuit board 11, to control the plurality of data drive circuit 4 and the gate drive circuit 3 in accordance with image data input from the outside of the device and a plurality of synchronization signals. When the timing control circuit 10 is arranged at the second printed circuit board 11, the timing control circuit 10 supplies the gate and data control signals via a plurality of connectors, a second flexible printed circuit, namely, the flexible printed circuit 9, and the first printed circuit board 8. The timing control circuit 10 arranges image data input from an external system or the like, to match with driving of the liquid crystal panel 2. In accordance with the image data and the plurality of synchronization signals, the timing control circuit 10 controls the data drive circuits 4 and gate drive circuit 3. In detail, the timing control circuit 10 arranges image data input from the outside of the device, to match with driving of the liquid crystal panel 2, and supplies the arranged image data to each data drive circuit 4. Using at least one of the synchronization signals, for example, a dot clock, a data enable signal, and horizontal and vertical synchronization signals, which are input from the outside of the device, the timing control circuit 10 generates the gate control signal and data control signals, and supplies the generated gate signal to the gate drive circuit 3 while supplying the generated data control signals to the data drive circuits 4.

Meanwhile, although not shown, a power supply unit may be separately provided. The power supply unit modulates a voltage level of input power supplied from the outside of the device to a plurality of predetermined voltage levels, to generate a common voltage, a positive DC drive voltage, a gate-on voltage, a gate-off voltage, a plurality of reference gamma voltages having different levels, etc. The power supply unit supplies the generated voltages to associated ones of the liquid crystal panel 2, gate drive circuit 3, and data drive circuits 4.

The flexible printed circuits 6 and 9 are arranged between at least two of the liquid crystal panel 2, data drive circuits 4, and timing control circuit 10, to electrically connect the at least two of the liquid crystal panel 2, data drive circuits 4, and timing control circuit 10. When each data drive circuit 4 is electrically connected by a corresponding one of the flexible printed circuits 6 and 9, the data drive circuit 4 may be mounted on the corresponding flexible printed circuit 6 or 9.

In detail, the data drive circuits 4 are mounted on respective first flexible printed circuits 6. The first flexible printed circuits 6, on which respective data drive circuits 4 are mounted, are arranged between the non-display area of the liquid crystal panel 2 and the first printed circuit board 8, to receive the arranged image data and data control signals via the first printed circuit board 8, and to send an analog image signal to the liquid crystal panel 2.

On the other hand, the second flexible printed circuit 9 is arranged between the first printed circuit board 8 and the second printed circuit board 11, to the arranged image data and data control signals input from the second printed circuit board 11 to the first printed circuit board 8.

The printed circuit boards 8 and 11 are arranged between at least two of the data drive circuits 4, flexible printed circuits 6 and 9, and timing control circuit 10, to electrically connect the at least two of the data drive circuits 4, flexible printed circuits 6 and 9, and timing control circuit 10. When the timing control circuit 10 is electrically connected by a corresponding one of the printed circuit boards 8 and 11, the timing control circuit 10 may be mounted on the corresponding printed circuit board 8 or 11.

In detail, the first printed circuit board 8 is arranged between the second flexible printed circuit 9 and the first flexible printed circuits 6, on which respective data drive circuits 4 are mounted, to supply the image data and data control signals input via the second flexible printed circuit 9 to the first flexible printed circuits 6, on which respective data drive circuits 4 are mounted.

On the other hand, the timing control circuit 10 is mounted on the second printed circuit board 11. The second printed circuit board 11, on which the timing control circuit is mounted, is electrically connected to the second flexible printed circuit 9, to supply the image data and data control signals to the second flexible printed circuit 9.

The element formation portion 12 includes a plurality of electrical elements regularly arranged on the element formation portion 12 in accordance with at least one predetermined rule. The element formation portion 12 may be provided at at least one of the flexible printed circuits 6 and 9 and printed circuit boards 8 and 11.

As described above, a plurality of electrical elements is regularly arranged on the element formation portion 12 in accordance with at least one predetermined rule. The plurality of electrical elements may include at least one kind of electrical elements selected from resistors, capacitors, inductors, diodes, and transistors. Alternatively, the plurality of electrical elements may include a combination of plural kinds of electrical elements as described above.

At least one kind of electrical elements among the electrical elements arranged at the element formation portion 12 may be arranged such that one or more positive voltage elements and one or more negative voltage elements are separated from each other. The electrical elements, which are of the same kind, may be arranged such that the electrical elements exhibiting lower potential differences between input and output terminals thereof are preferentially arranged adjacent to one another under the condition that separation between the positive and negative voltage elements is maintained. Alternatively, the electrical elements, which are of the same kind, may be arranged such that the electrical elements exhibiting lower potential differences between input and output terminals thereof are preferentially arranged adjacent to one another in order of input/output voltage levels. When the electrical elements, which are of at least one kind, are arranged in accordance with the above-described rule and arrangement method, it may be possible to minimize the potential difference between the adjacent electrical elements even when the adjacent electrical elements are electrically connected due to penetration of moisture and, as such, voltage difference caused by an erroneous voltage may also be minimized.

Figure 2:
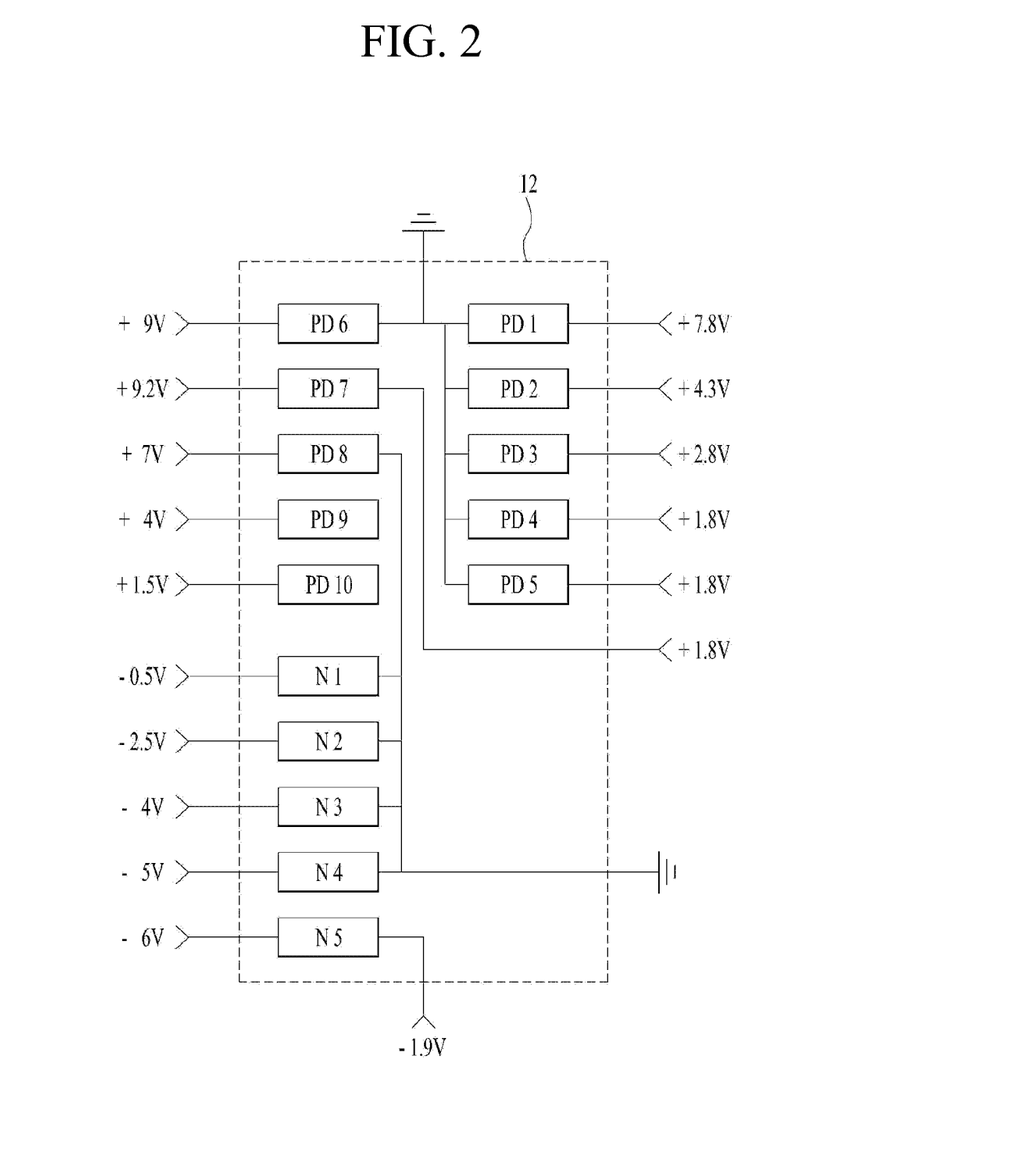
FIG. 2 is a diagram illustrating arrangement of electrical elements formed at the element formation portion of FIG. 1.

FIG. 2 is a diagram illustrating arrangement of the electrical elements formed at the element formation portion of FIG. 1.

As illustrated in FIG. 2, at least one kind of electrical elements among the electrical elements arranged at the element formation portion 12 are arranged such that one or more positive voltage elements, for example, positive voltage elements PD1 to PD10, and one or more negative voltage elements, for example, negative voltage elements N1 to N5, are separated from each other while being arranged in different regions in a grouped state. In other words, the electrical elements at the element formation portion 12 may be divided into positive and negative voltage elements such that the electrical elements having the same polarity are grouped to be arranged adjacent to one another. That is, the positive voltage elements PD1 to PD10 and the negative voltage elements N1 to N5 are grouped in different regions at the element formation portion 12.

For example, as illustrated in FIG. 2, the first to fifth positive voltage elements PD1 to PD5 may be grouped to be arranged adjacent to one another. In addition, the sixth to tenth positive voltage elements PD6 to PD10 may be grouped to be arranged adjacent to one another while being arranged adjacent to the first to fifth positive voltage elements PD1 to PD5. On the other hand, the first to fifth negative voltage elements N1 to N5 may be grouped to be arranged adjacent to one another.

Figure 3:
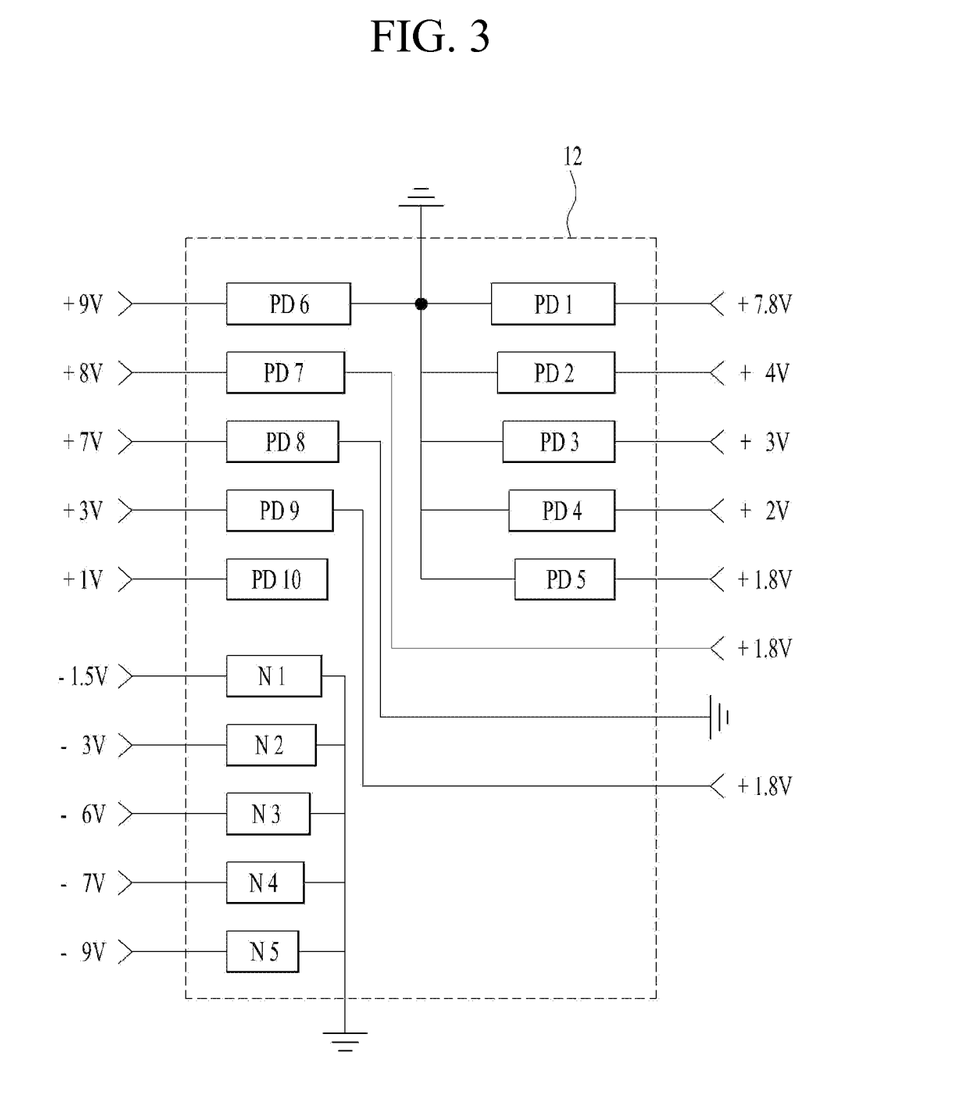
FIG. 3 is a diagram illustrating another arrangement of the electrical elements formed at the element formation portion of FIG. 1.

FIG. 3 is a diagram illustrating another arrangement of the electrical elements formed at the element formation portion of FIG. 1.

As illustrated in FIG. 3, at least one kind of electrical elements among the electrical elements arranged at the element formation portion 12, for example, the positive voltage elements PD1 to PD10 and negative voltage elements N1 to N5, may be arranged such that the electrical elements exhibiting lower potential differences between input and output terminals thereof among the electrical elements of the same kind are preferentially arranged adjacent to one another.

In other words, the positive voltage elements PD1 to PD10 and the negative voltage elements N1 to N5 may be separated from each other in accordance with polarity of output voltage while being arranged such that the electrical elements exhibiting lower potential differences between input terminals thereof among the electrical elements of the same kind are preferentially arranged adjacent to one another. When the potential difference between input or output voltages of the adjacent electrical elements is reduced, it may be possible to minimize the potential difference between the adjacent electrical elements even when the adjacent electrical elements are electrically connected due to penetration of moisture and, as such, voltage difference caused by an erroneous voltage may also be minimized.

Figure 4:
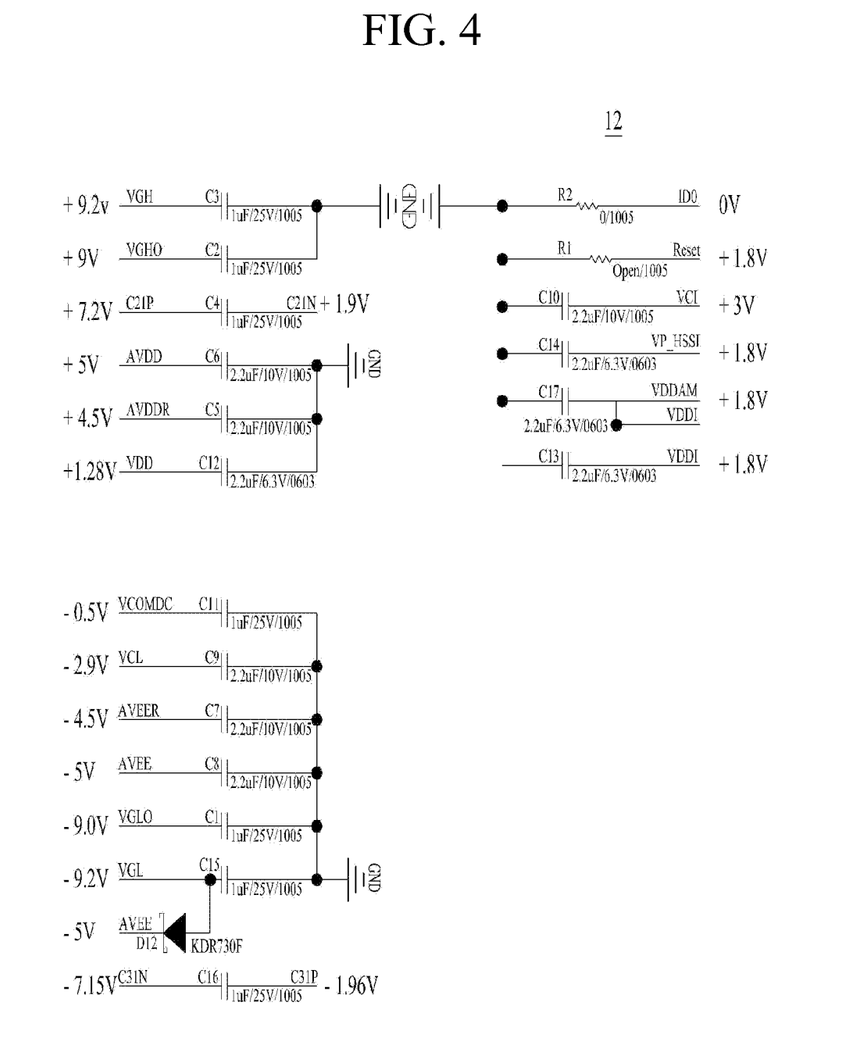
FIG. 4 is a circuit diagram illustrating configurations of the electrical elements formed at the element formation portion of FIG. 1.

FIG. 4 is a circuit diagram illustrating configurations of the electrical elements formed at the element formation portion of FIG. 1.

As illustrated in FIG. 4, at least one kind of electrical elements, for example, the positive voltage elements PD1 to PD10 and the negative voltage elements N1 to N5, are arranged such that the electrical elements exhibiting lower potential differences between input/output terminals thereof among the electrical elements of the same kind are preferentially arranged adjacent to one another while being arranged in order of levels of input/output voltages at the input/output terminals. In addition, formation directions of the input/output terminals may be determined such that the same polarity ones of the input/output terminals are directed in the same direction.

In other words, at least one kind of electrical elements, for example, the positive voltage elements PD1 to PD10 and the negative voltage elements N1 to N5, are arranged such that the electrical elements of the same kind are arranged in order of levels of input/output voltages at input/output terminals thereof under the condition that formation directions of the input/output terminals may be determined such that the same polarity ones of the input/output terminals are directed in the same direction.

It may be possible to minimize the potential difference between the adjacent electrical elements when the positive voltage elements PD1 to PD10 and the negative voltage elements N1 to N5 are arranged such that the electrical elements exhibiting lower potential differences between input/output terminals thereof among the electrical elements of the same kind are preferentially arranged adjacent to one another, and the electrical elements of the same kind are arranged in order of levels of input/output voltages at input/output terminals thereof under the condition that formation directions of the input/output terminals may be determined such that the same polarity ones of the input/ output terminals are directed in the same direction, as described above. In accordance with minimization of the potential difference between the adjacent electrical elements, it may be possible to minimize voltage difference caused by an erroneous voltage even when the adjacent electrical elements are electrically connected due to penetration of moisture. Accordingly, rate of erroneous operation may be reduced and, as such, an enhancement in reliability may be achieved.

As described above and in accordance with the image display device and the method for manufacturing the same, which have various technical features as described above, it may be possible to improve a watertight function while reducing rate of erroneous operation through improvement of an arrangement structure of the electrical elements formed at the drive circuits to drive the image display panel or control circuits, thereby achieving an enhancement in reliability.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An image display device, comprising:
   an image display panel for displaying an image;
   a plurality of data drive circuits for driving the image display panel;
   a timing control circuit for controlling driving timings of the data drive circuits;
   at least one flexible printed circuit arranged between at least two of the image display panel, the data drive circuits, and the timing control circuit, to electrically connect the at least two of the image display panel, the data drive circuits, and the timing control circuit;
   at least one printed circuit board arranged between at least two of the data drive circuits, the flexible printed circuit, and the timing control circuit, to electrically connect the at least two of the data drive circuits, the flexible printed circuit, and the timing control circuit; and
   an element formation portion provided at at least one of the flexible printed circuit and the printed circuit board and comprising a plurality of electrical elements regularly arranged on the element formation portion in accordance with at least one predetermined rule,
   wherein at least one kind of electrical elements among the electrical elements arranged at the element formation portion are arranged to be divided into one or more positive voltage elements and one or more negative voltage elements separated from the positive voltage elements such that the positive voltage elements and the negative voltage elements are grouped in different regions, and
   wherein at least one of the positive voltage elements is between and adjacent to two other positive voltage elements, or at least one of the negative voltage elements is between and adjacent to two other negative voltage elements.

2. The image display device according to claim 1, wherein the positive voltage elements and the negative voltage elements are arranged such that the electrical elements exhibiting lower potential differences between input and output terminals thereof among the electrical elements of the same kind are arranged adjacent to one another.

3. The image display device according to claim 2, wherein:
   the positive voltage elements and the negative voltage elements are arranged in order of levels of input/output voltages at the input/output terminals; and
   formation directions of the input/output terminals are determined such that the same polarity ones of the input/output terminals are directed in the same direction.

4. The image display device according to claim 1, wherein the kinds of electrical elements include resistors, capacitors, inductors, diodes, and transistors.

5. The image display device according to claim 1, wherein the grouped positive voltage elements include positive voltage elements at different positive potentials, and the positive voltage elements at the different positive potentials are arranged adjacent to each other in sequential order of increasing or decreasing potential.

6. The image display device of claim 1, wherein the grouped negative voltage elements include negative voltage elements at different negative potentials, and the negative voltage elements at the different negative potentials are arranged adjacent to each other in sequential order of increasing or decreasing potential.

7. A method for manufacturing an image display device, comprising:
   preparing an image display panel to display an image;
   preparing a plurality of data drive circuits to drive the image display panel;
   preparing a timing control circuit to control driving timings of the data drive circuits;
   attaching at least one flexible printed circuit between at least two of the image display panel, the data drive circuits, and the timing control circuit, to electrically connect the at least two of the image display panel, the data drive circuits, and the timing control circuit;
   attaching at least one printed circuit board between at least two of the data drive circuits, the flexible printed circuit, and the timing control circuit, to electrically connect the at least two of the data drive circuits, the flexible printed circuit, and the timing control circuit; and
   regularly arranging a plurality of electrical elements on at least one of the flexible printed circuit and the printed circuit board in accordance with at least one predetermined rule, thereby configuring at least one element formation portion,
   wherein the configuring at least one element formation portion comprises:
      dividing at least one kind of electrical elements among the plurality of electrical elements into one or more positive voltage elements and one or more negative voltage elements separated from the positive voltage elements in accordance with positive and negative operation characteristics; and
      arranging the positive voltage elements and the negative voltage elements to be grouped in different regions,
   wherein at least one of the positive voltage elements is between and adjacent to two other positive voltage elements, or at least one of the negative voltage elements is between and adjacent to two other negative voltage elements.

8. The method according to claim 7, wherein the configuring at least one element formation portion comprises arranging the positive voltage elements and the negative voltage elements such that the electrical elements exhibiting lower potential differences between input and output terminals thereof among the electrical elements of the same kind are arranged adjacent to one another.

9. The method according to claim 8, wherein the configuring at least one element formation portion comprises arranging the positive voltage elements and the negative voltage elements in order of levels of input/output voltages at the input/output terminals under the condition that formation directions of the input/output terminals are determined such that the same polarity ones of the input/output terminals are directed in the same direction.

10. The method according to claim 7, wherein the kinds of electrical elements include resistors, capacitors, inductors, diodes, and transistors.

11. The method according to claim 7, wherein the grouped positive voltage elements include positive voltage elements at different positive potentials, and the positive voltage elements at the different positive potentials are arranged adjacent to each other in sequential order of increasing or decreasing potential.

12. The method according to claim 7, wherein the grouped negative voltage elements include negative voltage elements at different negative potentials, and the negative voltage elements at the different negative potentials are arranged adjacent to each other in sequential order of increasing or decreasing potential.

* * * * *